March 17, 1970 G. O. CROWTHER ET AL Re. 26,821

STEPPING-TUBE MULTIPLE-STORE CIRCUIT EMPLOYING PLURAL COUNTER CHAINS SELECTIVELY GATED THROUGH SINGLE INTERSTAGE GATING CHAIN

Original Filed Dec. 19, 1963 2 Sheets-Sheet 1

INVENTORS
GERALD O. CROWTHER
GRAHAM F. JEYNES
BY
Frank R. Trifari
AGENT

March 17, 1970 G. O. CROWTHER ET AL Re. 26,821

STEPPING-TUBE MULTIPLE-STORE CIRCUIT EMPLOYING PLURAL COUNTER CHAINS SELECTIVELY GATED THROUGH SINGLE INTERSTAGE GATING CHAIN

Original Filed Dec. 19, 1963 2 Sheets-Sheet 2

INVENTORS
GERALD O. CROWTHER
GRAHAM F. JEYNES

BY Frank R. Trifari

AGENT

United States Patent Office

Re. 26,821
Reissued Mar. 17, 1970

26,821

STEPPING-TUBE MULTIPLE-STORE CIRCUIT EMPLOYING PLURAL COUNTER CHAINS SELECTIVELY GATED THROUGH SINGLE INTERSTAGE GATING CHAIN

Gerald Offley Crowther and Graham Frank Jeynes, Cheam, England, assignors, by mesne assignments, to U.S. Philips Corporation, New York, N.Y., a corporation of Delaware Original No. 3,308,337, dated Mar. 7, 1967, Ser. No. 331,678, Dec. 19, 1963. Application for reissue Feb. 3, 1969, Ser. No. 802,286
Claims priority, application Great Britain, Dec. 19, 1962, 47,958/62
Int. Cl. H01j *17/36*
U.S. Cl. 315—84.5 6 Claims

Matter enclosed in heavy brackets [ ] appears in the original patent but forms no part of this reissue specification; matter printed in italics indicates the additions made by reissue.

*ABSTRACT OF THE DISCLOSURE*

*A group of chains of cold cathode stepping tube counting circuits and a chain of gating circuits for transferring counting pulses between tubes in a chain, and a set of switches for connecting the gating chain to a desired chain of the tube group, thereby isolating or decoupling the remaining chains.*

Figure 1:
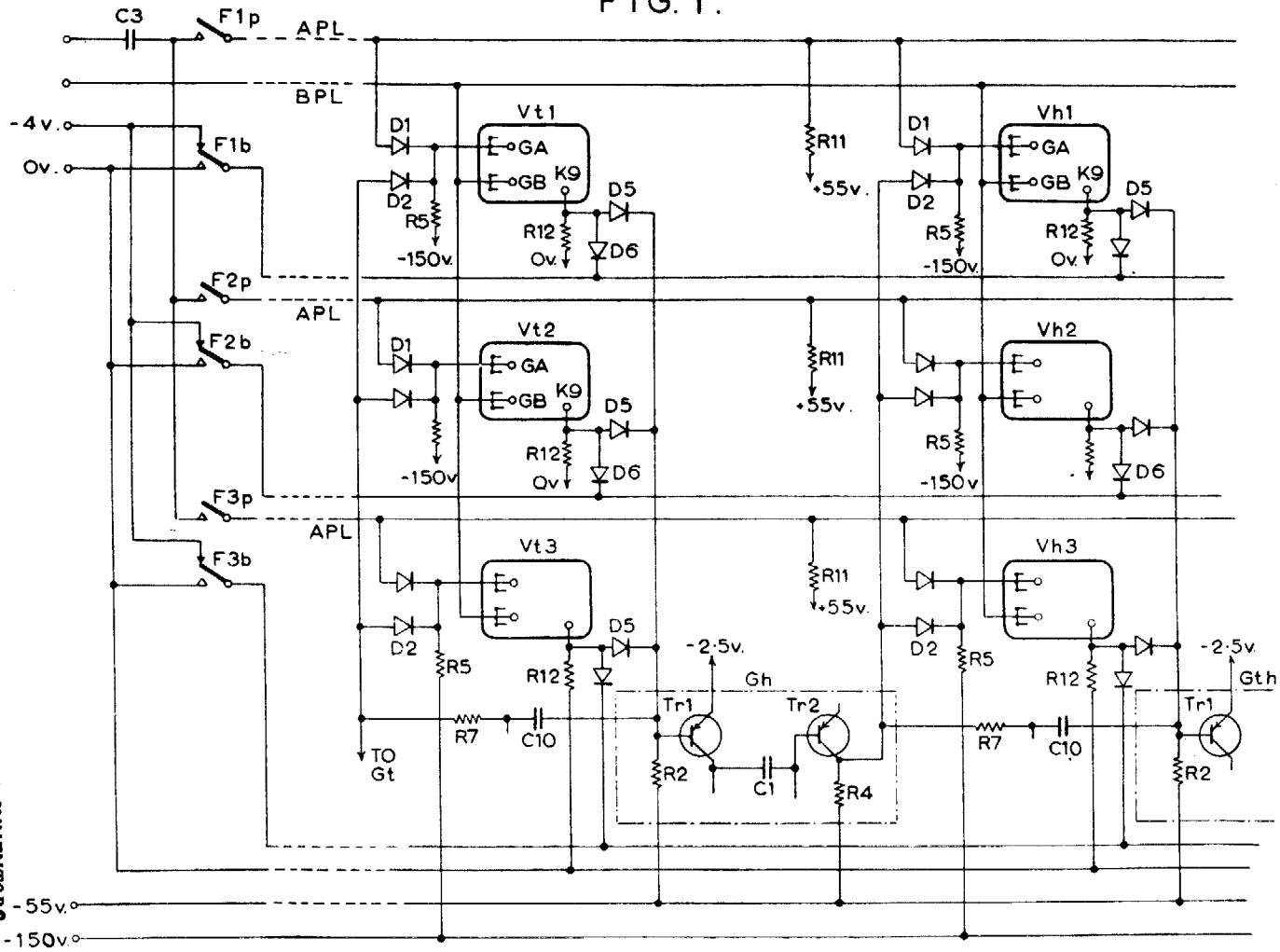

This invention relates to counting-circuits and more particularly to multiple chains of cold-cathode stepping-tube counting-circuits which may be used in small computing machines.

The invention provides an arrangement whereby a plurality of counting-circuits can be controlled by a single series of interstage gating circuits and thereby avoid the necessity of providing separate interstage gate circuits for each counting-chain.

The term "stepping tube" is herein used to define a tube having an electrode assembly comprising a common electrode, a plurality of switching electrodes and a plurality of further electrodes, wherein a stream of electrons and ions may be caused to travel between the common electrode and one of the further electrodes and wherein one end of the stream may be caused to move from one to another of the further electrodes in a predetermined sequence by the application of suitable potentials to the switching electrodes.

Usually, the central electrode is circular and functions as an anode, the other electrodes being arranged in a circular row, and when in use, being returned to a potential more negative than that to which the anode is returned. These other electrodes thus may correctly be regarded as cathodes; however, each position in the tube usually has associated with it three or four of these electrodes and it is convenient to distinguish them by referring to those on which the glow discharge rests between pulses as "main cathodes" or "cathodes" and to refer to the other electrodes as "guide electrodes" or "guides."

In known stepping tubes the transfer of the discharge from its rest position on one cathode to its rest position on the next cathode is thus effected by means of a plurality of guide electrodes; where there are two guide electrodes between adjacent cathodes the guide next to the cathode in the direction of rotation of the discharge is usually termed the "first" or A guide and the next guide again in the direction of rotation of the discharge, is termed the "second" or B guide. Throughout this specification the terms A guide and B guide will be used. In these known tubes all the A guides are usually connected together or "commoned" inside the envelope and all the B guides are similarly connected together; in operation the discharge is transferred in its entirety from its rest position on one cathode to an A guide, then from the said A guide to a B guide and finally from the B guide to the next cathode.

According to one aspect of the present invention the counting arrangement includes a plurality of counting-chains wherein each counting-chain comprises a chain of cold-cathode stepping-tube stages. A series of interstage gate circuits are arranged so that a gate circuit can be connected between each pair of successive stepping-tube stages, and means are provided for so connecting the gate circuits into a selected chain. Further means are connected to the chains for inhibiting the application of stepping pulses to one set of all stepping-tube guide electrodes in the unselected chains.

Figure 2:
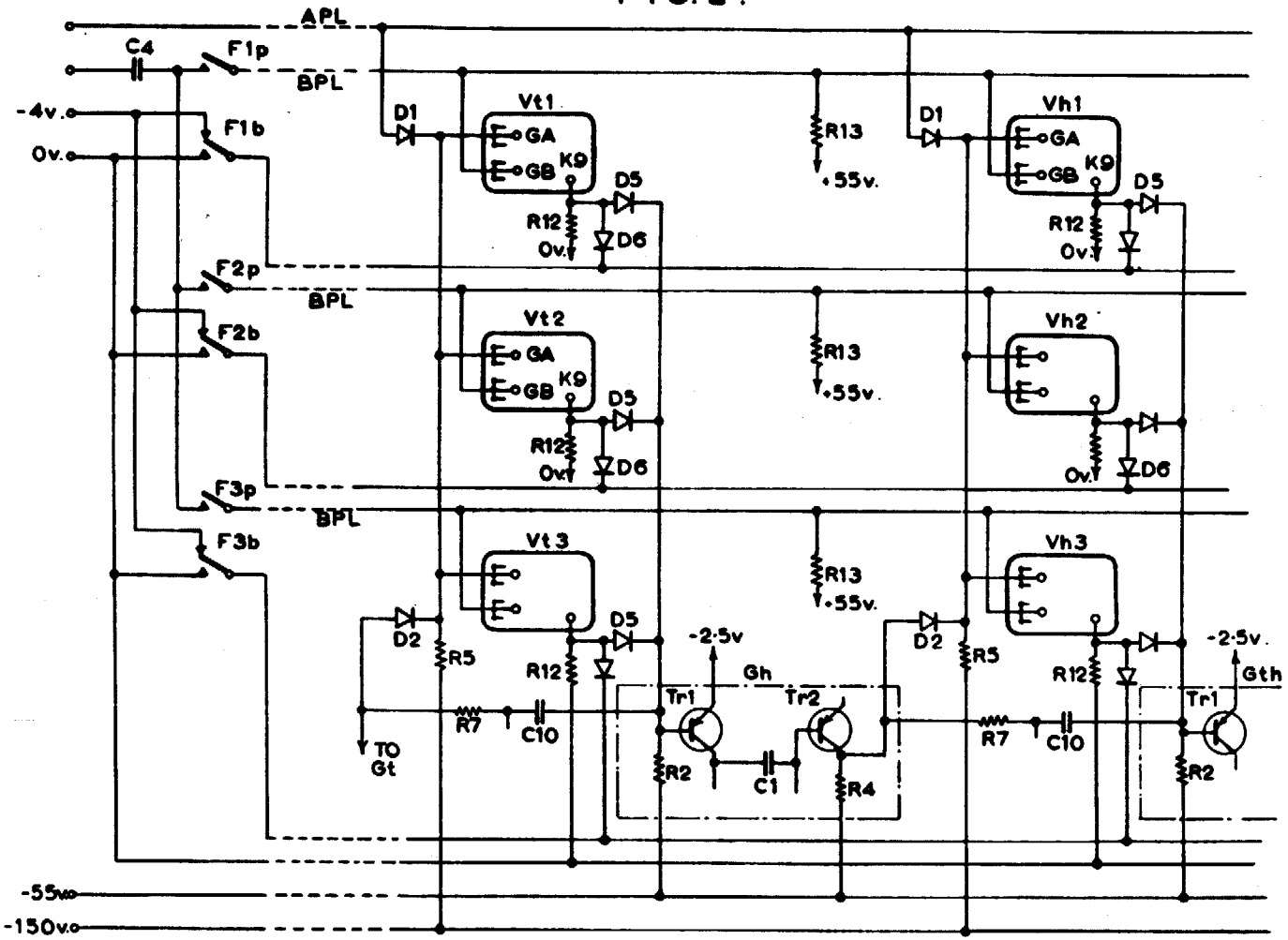

An embodiment of the invention will now be described with reference to the accompanying diagrammatic drawings wherein, FIGURE 1 illustrates a first embodiment, and FIGURE 2 illustrates a second embodiment.

Referring to FIGURE 1 this shows three stepping-tube counting chains of a general arrangement substantially similar to that described in our copending U.S. application Serial Number 331,676, filed December 19, 1965. Only part of each chain is shown and these parts include stepping-tubes Vt1 and Vh1 of the "tens" and "hundreds" stages respectively for the first chain, together with tubes Vt2 and Vh2 for the second chain and tubes Vt3 and Vh3 for the third chain. Interstage gates, of which the "hundreds" gate Gh and the "thousands" gate Gth are shown in part are provided for association with each counting-chain: these gates are the same as those described in detail in the above-mentioned specification.

The B guides GB of the stepping-tubes in all chains are connected to a common B pulse line BPL but the A guides GA in each stage are returned through a diode D1 to an A pulse line APL associated with the appropriate chain so that there are three A pulse lines, one for each chain, to which the guides GA are returned through respective diodes D1. Each stage in each chain is also connected through a respective diode D2 to the output of the common interstage rate preceding the stage so that this common gate is thus connected through respective-diodes D2 to the guides GA of the appropriate tube in each chain.

We thus have all the B guides GB connected to a common pulse line while the A guides GA are connected to individual pulse lines; in order to associate any selected counting-chain with the interstage gate circuits it is necessary that A pulses can be applied to the A guides of the selected chain while the A guides of the other chains are maintained at such a positive potential as will prevent the discharges in the tubes of these chains from stepping onto any of the A guides. This is effected by means of a series of switches F of which there is one, F1, F2 or F3, for each chain; each switch F has contacts, indicated on FIGURE 1 by the subscript p, which when closed apply A pulses from the common A pulse line to the A pulse line of the appropriate chain. In order that when any of these contacts is open the A guides of that chain are returned to a suitable positive voltage, a capacitor C3 of the order of 0.1 $\mu$f. is inserted in the common A pulse line between the A pulse source and the switches F, and the A pulse line of each chain is returned through a 10K ohm resistor R11 to a 55 v. positive source.

It is a further requirement that the "count" stored in each chain should neither affect nor be affected by either the count stored in another chain or the process of counting in another chain. This means that any voltage appearing at the ninth cathode K9 of any chain should not affect the voltage at the K9 cathodes of the corresponding stages in other chains and also means that any variation in such voltage occurring during counting in one chain should have no effect upon the other chain. To this end, the K9 cathode of corresponding stages in each chain are commoned not directly but through respective diodes D5 each of which is connected to the base of transistor Tr1 in the interstage gate. Each cathode K9 has connected to it a diode D6 as described in the above-mentioned specification and in each chain these diodes are returned to a common line which can be connected to either a zero voltage source or a 4 v. negative source. Each cathode K9 is also returned through a 1M ohm resistor R12 to a zero-voltage line: with the arrangement as shown in FIGURE 1 all the diodes D6 are returned through "bias" contacts F1b, F2b and F3b to a 4 v. negative source: in this condition the voltage at each ninth cathode K9 is held at −4 v., and if one chain is then switched into a counting condition as described below and counting is caused to take place in that chain, then any positive voltage appearing at the cathode K9 of any tube in that chain will not affect the voltage of −4 v. which is applied through the diodes D6 to the K9 cathodes of the tubes of the other chains.

Consider now the operation of counting into a particular chain, for illustration the first that is the upper chain in FIGURE 1. Switch F1 is operated to select this chain and "pulse" contacts F1p connect the A pulse line of the chain to the A pulse source. The "bias" contacts F1b remove the −4 v. bias from the diodes D6 in the chain and return these diodes to a zero voltage source so that in each stepping-tube of the selected chain where the discharge is not on K9 the K9 voltage will be clamped at about −3 v. by the emitter-base diode of Tr1. If counting is now allowed to proceed in this chain then when the discharge reaches the K9 of, for instance Vt1 then as the diode D6 is now returned to a zero voltage line the voltage at this cathode will rise from −3 v. to zero volts. This zero voltage is now applied through D5 to the base of Tr1 in the gate Gh and as the emitter of this transistor is returned to a negative source of 2.5 v. then this transistor will be cut off. The effect of cutting off this transistor and the operation of the gate circuit is described in detail in the above-mentioned specification.

However, although the voltage at the base of Tr1 has been raised to zero, this voltage will not be passed to the K9 cathodes of Vt2 or Vt3 because these cathodes are returned, each through a respective diode D6, to a −4 v. source and their associated diodes D5 will thus be non-conducting. When the discharge leaves the ninth cathode K9 of Vt1 then the voltage at the base of Tr1 will fall to about −3 v. which however is still positive with respect to the −4 v. bias applied to the second and third chain so that the diodes D5 associated with Vt2 and Vt3 will remain non-conducting.

If the discharge on Vt2 or Vt3 is on the K9 cathode this cathode will still be held at −4 v. through diode D6; the cathode current will flow through D6 to the 4 v. negative line.

To provide a "carry" facility an interstage coupling circuit from each gate to the next is provided by resistor R7 and capacitor C10 as described in more detail in copending U.S. application Serial No. 331,677. If a selective "read-in" facility is provided as described in that specification then the junction of these two circuit components will be taken through suitable switch contacts to the pre-pulse line; if such a facility is not required however then the resistor R7 may, if desired, be dispensed with leaving only the capacitor C10 as described and illustrated in copending U.S. application Serial No. 331,676.

In the embodiment just described only the A guides are switched so that on the arrival of B pulses along the common B pulse line all tubes in the unselected chains will step back to a B guide and will then, at the end of the B pulse, step onto the cathodes on which the discharge originally rested. The arrangement is however rather expensive in diodes and in a second embodiment illustrated in FIGURE 2 all the A guides are returned to a common pulse line whilst the B guides are switched. Referring to FIGURE 2 it will be seen that at each stage only one pair of diodes D1 and D2 is necessary for all chains; it is no longer necessary to discriminate between the A guides of one chain and those of the others because the discrimination is effected by switching the B guides. The output from each gate is applied through a diode D2 to the commoned A guides GA of that stage in all chains, and from those commoned guides a diode D1 is connected to the common A pulse line.

The B pulse source is applied from a common pulse line through a capacitor C4 of the order of 0.1 $\mu$f. to the "pulse" contacts of the three switches F and the B pulse line of each chain is returned through a 10K ohm resistor R13 to a 55 volt positive source; the "bias" contacts of each of the switches F are arranged in the same manner as already described and illustrated in FIGURE 1. The input circuits of each gate are identical with those described above and the function of the diodes D5 and D6 in each stage is the same as that already described. When a discharge is on a ninth cathode K9 of a stepping-tube in the selected chain the next A pulse will be applied to tubes in the corresponding stages in the other chains so that all will therefore step on to the next following A guide each time an A pulse is applied along the common pulse line; at the end of this A pulse the discharges in the unselected chains will step back to the cathodes upon which they rested but this will have no effect on the gate circuits because of the blocking function of diodes D5 described above.

In both the circuits described above transistor Tr2 is associated with one or more diodes D2; however, as described in U.S. application 331,676 and U.S. application 331,677 a high voltage transistor may be used for Tr2 in which case the appropriate diodes D2 can be omitted in a manner substantially the same as that described in those specifications.

What we claim is:

1. An electronic counting-arrangement comprising a common pulse-line for supplying counting pulses, a plurality of counting chains each comprising a chain of cold-cathode stepping-tube stages of successively higher order, a chain of interstage gating-circuits, means for connecting the chain of gating circuits into a selected counting chain to provide a gating-circuit between each pair of successive stepping-tube stages of the selected counting chain, and means for causing only the stepping-tubes of the selected chain to respond to counting-pulses supplied to all the counting-chains from the said common pulse-line.

2. An electronic counting-arrangement as claimed in claim 1 comprising means for applying negative-going counting-pulses to guides of all stepping-tubes in all the chains, means for causing attenuation of counting pulses at the guides of stepping-tubes in the unselected chains, attenuating means in each gating circuit to attenuate counting-pulses at the guides of the immediately-succeeding stepping-tube stage of the selected chain, and means in each gating circuit responsive to an output condition in the immediately-proceeding stepping-tube stage of the selected chain to render said attenuating means inoperative and thereby to provide throughout the counting-chain a "carry" facility between each pair of successive stepping-tube stages.

3. An electronic counting-arrangement as claimed in claim 1 wherein the stepping-tubes are of the two guide type, and wherein the attenuating means in each gating circuit is operable to attenuate only pulses applied to the said first guides.

4. An electronic counting-arrangement as claimed in claim 3 comprising a pulse-line for each counting-chain, a plurality of first diodes in each counting-chain connected one between the first guides of each stepping-tube and the pulse-line of the chain, a plurality of second diodes connected one between the first guides of each corresponding stepping-tube stage in all the counting chains and the gating circuit preceding the said corresponding stepping-tube stages, means for supplying counting-pulses to the pulse line of the selected counting-tube chain to cause counting only in the selected chain, and means in each gating-circuit responsive to the output from a preceding stepping-tube stage to effect a "carry" by permitting the first diode in the succeeding stepping-tube stage to fully conduct counting-pulses from the selected pulse line to the first guides of the said succeeding stepping-tube stage.

5. An electronic counting-arrangement as claimed in claim 4 comprising a second, common, pulse-line for supplying pulses to the sets of second guides of all stepping-tubes in all counting-chains.

6. An electronic counting-arrangement as claimed in claim 3 comprising a first, common, pulse-line for supplying pulses to the sets of first guides of all stepping tubes in all counting chains, a second pulse-line for each separate counting-chain, means connecting the second pulse-line in each counting-chain to the second guides of the stepping tubes of that counting-chain, means connecting the first guides of each of corresponding stepping-tube stages in different counting-chains to a corresponding gating-circuit to enable each gating-circuit to control counting-pulses supplied to the first guides of corresponding stages in each counting-chain, and means for supplying counting-pulses to the second pulse-line of the selected counting-chain to cause counting only in the selected chain.

References Cited

The following references, cited by the Examiner, are of record in the patented file of this patent or the original patent.

UNITED STATES PATENTS

| | | | |
|---|---|---|---|
| 3,029,310 | 4/1962 | Heiser | 328—154 |
| 3,087,142 | 4/1963 | Buck | 328—154 |

JAMES W. LAWRENCE, Primary Examiner

V. LAFRANCHI, Assistant Examiner

U.S. Cl. X.R.

328—51, 152